United States Patent
Lopatin et al.

(10) Patent No.: US 6,717,236 B1
(45) Date of Patent: Apr. 6, 2004

(54) METHOD OF REDUCING ELECTROMIGRATION BY FORMING AN ELECTROPLATED COPPER-ZINC INTERCONNECT AND A SEMICONDUCTOR DEVICE THEREBY FORMED

(75) Inventors: Sergey Lopatin, Santa Clara, CA (US); Alexander H. Nickel, Mountain View, CA (US); Paul L. King, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/084,563

(22) Filed: Feb. 26, 2002

(51) Int. Cl.$^7$ ............... H01L 27/082; H01L 27/102; H01L 21/4763
(52) U.S. Cl. ............... 257/586; 257/750; 257/758; 257/762; 438/643; 438/652; 438/677; 438/687
(58) Field of Search ............... 438/677, 687, 438/643, 652, 627; 205/82, 170, 182, 183, 115; 257/750, 758, 762, 586

(56) References Cited

U.S. PATENT DOCUMENTS

| | | | |
|---|---|---|---|
| 6,022,808 A | 2/2000 | Nogami et al. | |
| 6,197,181 B1 | 3/2001 | Chen | |
| 6,313,064 B1 * | 11/2001 | Miyafuji et al. | 502/345 |
| 6,486,533 B2 * | 11/2002 | Krishnamoorthy et al. | 257/586 |
| 6,515,368 B1 * | 2/2003 | Lopatin et al. | 257/762 |
| 2002/0008034 A1 * | 1/2002 | Chen et al. | 205/82 |
| 2002/0084529 A1 * | 7/2002 | Dubin et al. | 257/774 |

OTHER PUBLICATIONS

Peter Van Zant, "Microchip Fabrication: A Practical Guide to Semiconductor Processing", 3$^{rd}$ Ed., p. 392 and 397 (1997).

A. Krishnamoorthy, D. Duquette and S. Murarka, "Electrochemical Codeposition and Electrical Characterization of a Copper–Zinc Alloy Metallization", in edited by Adricacos, et al., Electrochem Society Symposium Proceedings, vol. 99–9, May 3–6, Seattle, p. 212.

J. Cunningham, "Using Electrochemistry to Improve Copper Interconnect", in Semiconductor International, Spring 2000 (May).

L. Chen and T. Ritzdorf, "ECD Seed Layer for Inlaid Copper Metallization" in edited by Andricacos, et al., Electrochem Society Proceedings, vol. 99–9, May 3–6, Seattle, p. 122.

* cited by examiner

Primary Examiner—W. David Coleman
Assistant Examiner—Hsien Ming Lee
(74) Attorney, Agent, or Firm—Farjami & Farjami LLP (57) ABSTRACT

A method of reducing electromigration in a dual-inlaid copper interconnect line (3) by filling a via (6) with a Cu-rich Cu—Zn alloy (30) electroplated on a Cu surface (200 from a stable chemical solution, and by controlling the Zn-doping thereof, which also improves interconnect reliability and corrosion resistance, and a semiconductor device thereby formed. The method involves using a reduced-oxygen Cu—Zn alloy as fill (30) for the via (6) in forming the dual-inlaid interconnect structure (35). The alloy fill (30) is formed by electroplating the Cu surface (20) in a unique chemical solution containing salts of Zn and Cu, their complexing agents, a pH adjuster, and surfactants, thereby electroplating the fill (30) on the Cu surface (20); and annealing the electroplated Cu—Zn alloy fill (30); and planarizing the Cu—Zn alloy fill (30), thereby forming the dual-inlaid copper interconnect line (35).

18 Claims, 5 Drawing Sheets

METHOD OF REDUCING ELECTROMIGRATION BY FORMING AN ELECTROPLATED COPPER-ZINC INTERCONNECT AND A SEMICONDUCTOR DEVICE THEREBY FORMED

CROSS-REFERENCE TO RELATED APPLICATION(S)

This application is also related to the following commonly assigned applications, entitled:

(1) "Chemical Solution for Electroplating a Copper-Zinc Alloy Thin Film," concurrently filed U.S. (10/081,074);

(2) "Method of Electroplating a Copper-Zinc Alloy Thin Film on a Copper Surface Using a Chemical Solution and a Semiconductor Device thereby Formed," concurrently filed (U.S. 10/082,432);

(3) "Method of Controlling Zinc-Doping in a Copper-Zinc Alloy Thin Film Electroplated on a Copper Surface and a Semiconductor Device Thereby Formed," concurrently filed (U.S. 10/082,433);

(4) "Method of Reducing Electromigration in a Copper Line by Electroplating an Interim Copper-Zinc Alloy Thin Film in a Copper Surface and a Semiconductor Sevice thereby Formed," concurrently filed (U.S. 10/083,809);

(5) "Method of Reducing Electromigration in a Copper Line by Zinc-Doping of a Copper Surface from an Electroplated Copper-Zinc Alloy Thin Film and a Semiconductor Device thereby formed," filed on Dec. 7, 2001, (U.S. 10/016,410; now issued as U.S. (6,515,368); and (6) "Method of Reducing Electromigration by Ordering Zinc-Doping in an Electroplated Copper-Zinc Interconnect and a Semicinductor Device thereby Formed," filed on Dec. 7, 2001, (U.S. 10/016,645).

FIELD OF THE INVETION

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with a barrier material using wet chemical methods.

BACKGROUND ART

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractory metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma-enhanced chemical vapor deposition (PECVD), sputtering, electroless plating, and electrolytic plating.

However, some disadvantages of using Cu as an interconnect material include etching problems, corrosion, and diffusion into silicon.[1] These problems have instigated further research into the formulation of barrier materials for preventing electromigration in both Al and Cu interconnect lines. In response to electromigration concerns relating to the fabrication of semiconductor devices particularly having aluminum copper alloy interconnect lines, the industry has been investigating the use of various barrier materials such as titanium-tungsten (TiW) and tanium nitride (TN) layers as well as refractory metals such as titanium (Ti), tungsten (W), tantalum (Ta), molybdenum (Mo), and their silicides.[2] Although the foregoing materials are adequate for Al interconnects and Al—Cu alloy interconnects, they have not been entirely effective with respect to all-Cu interconnects. Further, though CVD and PECVD have been conventionally used for depositing secondary metal(s) on a primary metal interconnect surface, neither technique provides a cost-effective method of forming a copper-zinc alloy on a Cu interconnect surface. Therefore, a need exists for a low cost and high throughput method of reducing electromigration in a dual-inlaid copper interconnect line by filling a via with a copper-zinc (Cu—Zn) alloy electroplated on a copper (Cu) surface from a stable chemical solution, and by controlling the Zn-doping thereof, which also improves interconnect reliability and corrosion resistance.

DISCLOSURE OF INVENTION

Accordingly, the present invention provides a method of reducing electromigration in a dual-inlaid copper interconnect line by filling a via with a Cu-rich (e.g., approximately 99.8 at.% to approximately 98 at.%/o) copper-zinc (Cu—Zn) alloy electroplated on a copper (Cu) surface from a stable chemical solution, and by controlling the Zn-doping thereof (e.g., approximately 0.2 at.% to approximately 2.0 at.%), which also improves interconnect reliability and corrosion resistance, and a semiconductor device thereby formed. The present method involves filling the via by electroplating the Cu surface, such as a blanket Cu seed layer and a partial thickness plated Cu layer, in a unique nontoxic aqueous chemical electroplating solution containing salts of zinc (Zn) and copper (Cu), their complexing agents, a pH adjuster, and surfactants, thereby forming an electroplated Cu—Zn alloy fill having some degree of oxygen (O) concentration, wherein the Zn-doping is controllable by varying the electroplating conditions; and annealing the Cu—Zn alloy fill formed on the Cu surface in an environment such as vacuum, nitrogen ($N_2$), hydrogen ($H_2$), forming ($N_2H_2$), or mixtures thereof for reducing the O-concentration in the alloy fill, for modifying the grain structure of the Cu—Zn alloy fill as well as of the underlying Cu surface, and for forming a mixed Cu—Zn/Cu interface, thereby forming the dual-inlaid interconnect structure. The present invention further provides a particular electroplating method which controls the parameters of Zn concentration, pH, temperature, and time in order to form a uniform reduced-oxygen copper-zinc (Cu—Zn) alloy fill on a cathode-wafer surface such as a copper (Cu) surface for reducing electromigration in the device by deceasing the drift velocity therein which decreases the Cu migration rate in addition to decreasing the void formation rate.

More specifically, the present invention provides a method of fabricating a semiconductor device, having a reduced-oxygen copper-zinc (Cu—Zn) alloy fill formed on a copper (Cu) surface by electroplating the Cu surface in a chemical solution, generally comprising the steps of: providing a semiconductor substrate having a Cu surface (e.g., seed layer), the Cu surface having been formed by CVD, PVD, PECVD, ALD, or electroplating, an optional barrier layer, and an optional underlayer formed in a via; providing a chemical solution; immersing the Cu surface in the chemical solution, thereby forming a Cu—Zn alloy fill on the Cu surface in the via; rinsing the Cu—Zn alloy fill in a solvent; drying the Cu—Zn alloy fill under a gaseous flow; annealing the Cu—Zn alloy fill formed on the Cu surface, thereby forming a reduced-oxygen Cu—Zn alloy fill; planarizing the reduced-oxygen Cu—Zn alloy fill, the Cu surface, the optional barrier layer, and the optional underlayer, thereby forming a Cu—Zn alloy dual-inlaid interconnect structure; and completing formation of the semiconductor device.

By electroplating this Cu—Zn alloy fill in the via and on the cathode-wafer surface, such as a Cu surface, using a stable chemical solution in the prescribed concentration ranges and subsequently annealing the Cu—Zn alloy fill electroplated on the Cu surface, the present invention improves Cu interconnect reliability, enhances electromigration resistance, improves corrosion resistance, and reduces manufacturing costs. In particular, the present invention chemical solution is advantageous in that it facilitates formation of an acceptable Cu—Zn alloy fill over a wide range of bath compositions while the subsequent annealing step removes undesirable oxygen impurities from the formed alloy fill. The desirable Zn concentration in the Cu—Zn alloy fill, preferably in a range of approximately 0.2 at% to approximately 2.0 at% determined by X-Ray Photoelectron Spectroscopy (XPS) or Auger Electron Spectroscopy (AES), is controllable by varying the electroplating conditions and/ or the bath composition. By so controlling the Zn-doping, the present method balances high electromigration performance against low resistively requirements. Additionally, the Cu surface (e.g., seed layer), being formed by a technique such as electroless deposition, ion metal plasma (IMT), self-ionized plasma (SIP), hollow cathode magnetron (HCM), chemical vapor deposition (CVD), and atomic layer deposition (ALD), is enhanced by the Cu—Zn alloy fill layer and is prevented from etching by the high pH value (i.e., basic) of the chemical solution from which the alloy fill layer is formed.

Further advantages arise from the present invention's superior fill-characteristics. The present Cu—Zn electroplating solution facilitates better filling of the via on an interconnect, especially for feature sizes in a dimensional range of approximately 0.2 $\mu$m to approximately 0.05 $\mu$m, thereby lowering the resistance of the formed Cu—Zn alloy fill (e.g., in a resistance range of approximately 2.2 $\mu\Omega$·cm to approximately 2.5 $\mu\Omega$·cm for approximately 1 at.% Zn content in a Cu—Zn alloy fill, as deposited). Further, the filling capability is enhanced by three beneficial characteristics of the present invention: (1) the instant chemical solution does not etch copper or a copper alloy seed layer; (2) the introduction of Zn into the alloy fill as well as onto the Cu interconnect improves both step coverage and nucleation; and (3) a variety of organic additives, such as polyethylene glycol (PEG), organo-disulfides, and organo-chlorides, are compatible and may be included in the instant chemical solution for further enhancing the fill profile and grain structure. The present Cu—Zn electroplating solution provides a desirably low Zn content in a Cu alloy interconnect (e.g., in a concentration range of approximately 0.2 at.% to approximately 1.0 at%) which also imparts (1) a de minimis increase in resistance as well as (2) a maximum improvement in electromigration resistance. The present chemical solution can also provide a desirably low Zn content (e.g., in a range of <<approximately 0.1 at.% or <<approximately 0.2 at %, virtually undetectable by AES) in a Cu film, wherein the Zn content may be engineered by varying the deposition parameters as well as by modifying the bath composition.

BRIEF DESCRIPTION OF THE DRAWING(S)

For a better understanding of the present invention, reference is made to the below-referenced accompanying drawings. Reference numbers refer to the same or equivalent parts of the present invention throughout the several figures of the drawings.

MODES FOR CARRYING OUT THE INVENTION

Figure 1:
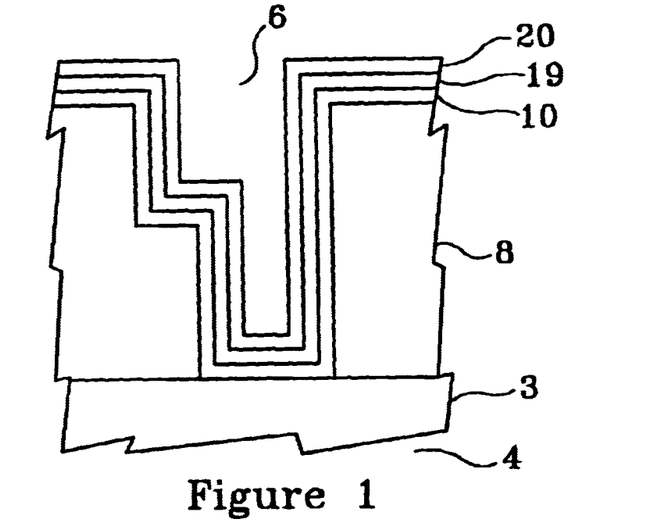
FIG. 1 is a crossectional view of a Cu interconnect line formed on a semiconductor substrate and acting as the bottom portion of a via, the via sidewalls comprising at least one low dielectric constant layer, the via having an optional barrier layer formed therein, an optional underlayer formed on the optional barrier layer, and a Cu surface (e.g., a seed layer) formed on the optional underlayer, and a Cu—Zn alloy fill formed and annealed on the Cu surface, in accordance with the present invention.

FIG. 1 illustrates, by example only, in cross-section, a Cu interconnect line 3 formed on a semiconductor substrate 4 and acting as the bottom portion of a via 6, the via 6 sidewalls comprising at least one low dielectric constant layer 8, in a dielectric constant range of approximately 1.6 to approximately 2.3, the via 6 having an optional barrier layer 10 formed by a technique such as chemical vapor deposition (CVD) or atomic layer deposition (ALD), comprising at least one material selected from a group consisting essentially of titanium silicon nitride ($Ti_xSi_yN_2$), tantalum nitride (TaN), and tungsten nitride ($W_xN_y$) in a thickness range of approximately 30 Å to approximately 50 Å, formed therein, an optional underlayer 19, comprising at least one material selected from a group consisting essentially of tin (Sn) and palladium Ed) and having a thickness of range of approximately 15 Å to approximately 50 Å(preferably approximately 30 Å), formed on the optional barrier layer 10, and a Cu surface 20 (e.g., an electroless seed layer) in a thickness range of approximately 50 Å approximately 70 Å, formed on the optional underlayer 19, in accordance with the present invention.

Figure 2:
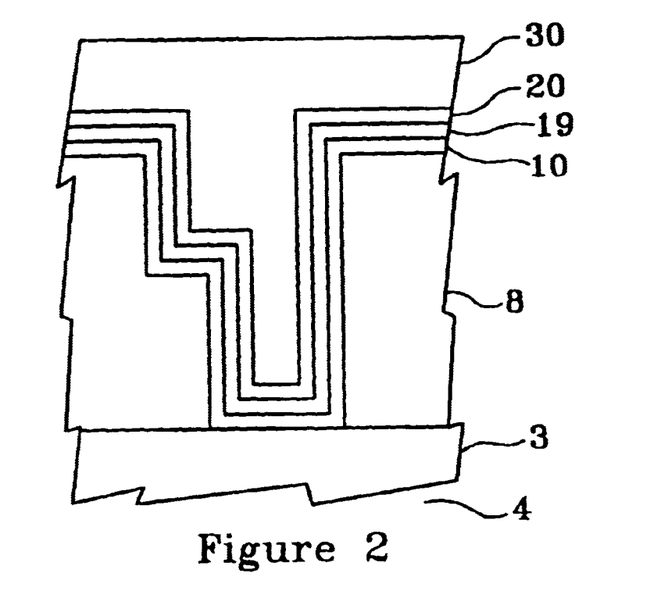
FIG. 2 is a cross-sectional view of the features shown in FIG. 1, further having a Cu—Zn alloy fill formed and annealed in the via and on the Cu-surface, in accordance with the present invention.

FIG. 2 illustrates, in cross-section, the features as shown in FIG. 1, further having a Cu—Zn alloy fill 30 in a thickness range of approximately 0.3 µm to approximately 0.7 µm, the alloy fill 30 having a Zn-content in a range of approximately 0.2 at.% to approximately 2 at.% (preferably approximately 0.5 at.%), and the alloy fill 30 being formed and annealed, at a temperature range of approximately 150° C. to approximately 350° C., in the via 6 and on the Cu-surface 20, thereby extending the Cu—Zn alloy fill 30 through the Cu surface 20 via Zn-diffiusion, thereby intermixing the alloy fill 30 with Sn and/or Pd from the optional underlayer 19, and thereby forming very strong interfaces, especially with the optional barrier layer 10, in accordance with the present invention. These very strong interfacial layers are formed in the following configuration: Cu—Zn alloy layer in bulk comprising alloy fill 30; a Cu—Zn—Sn—Pd alloy layer 29 in a thickness range of approximately 50 Å to approximately 100 Å; and the optional barrier layer 10 in a thickness range of approximately 30 Å to approximately 50 Å.

Figure 3:
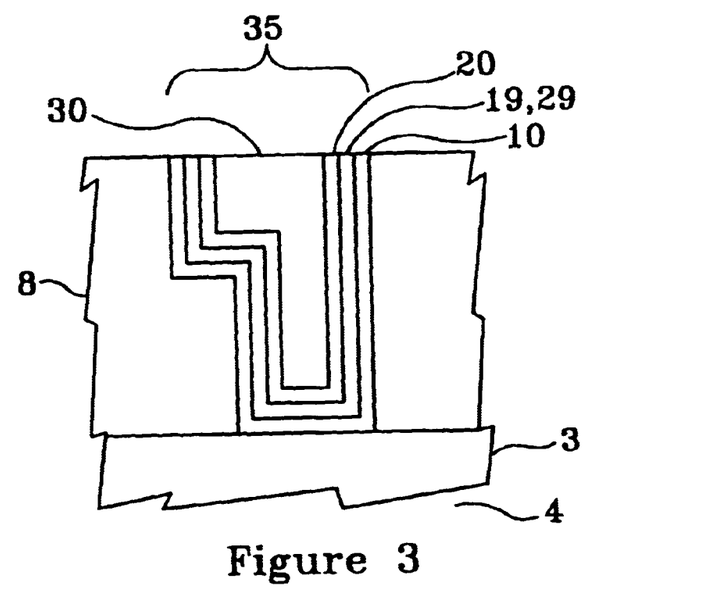
FIG. 3 is a cross-sectional view of the features shown in FIG. 2, further having been planarized to form a Cu—Zn alloy fill dual-inlaid interconnect structure, in accordance with the first embodiment of the present invention.

FIG. 3 illustrates, in cross-section, the features as shown in FIG. 2, further having been planarized, by a technique such as chemical mechanical polishing (CMP) or electropolishing, thereby removing sufficient conductive material from the surface to form a Cu—Zn alloy fill dual-inlaid interconnect structure 35, in accordance with the present invention.

Figure 4:
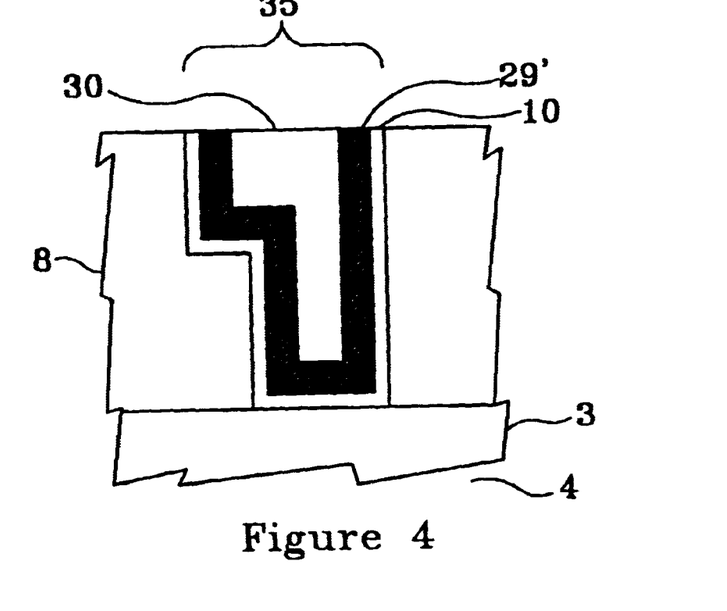
FIG. 4 is a cross-sectional view of the features shown in FIG. 3, wherein the Cu—Zn alloy fill dual-inlaid interconnect structure also comprises a mixed layer, and wherein the mixed layer comprises the optional underlayer, the Cu surface, and the Cu—Zn—Sn—Pd alloy layer, in accordance with the present invention.

FIG. 4 illustrates, in cross-section, the features as shown in FIG. 3, wherein the Cu—Zn alloy fill dual-inlaid interconnect structure 35 also comprises a mixed layer 29', and wherein the mixed layer 29' comprises the optional underlayer 19, the Cu surface 20, and the Cu—Zn—Sn—Pd alloy layer 29, in accordance with the present invention.

Figure 5:
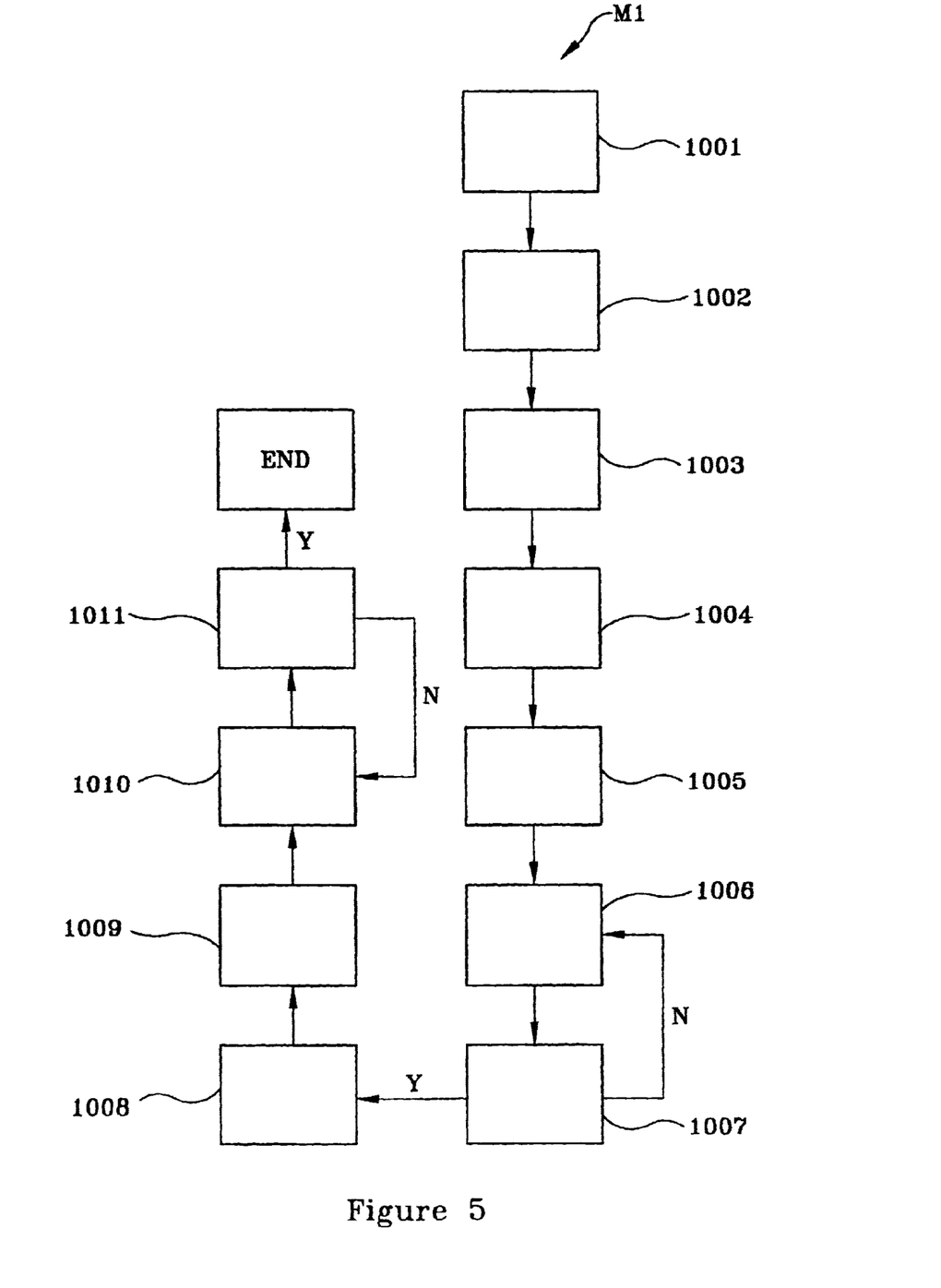
FIG. 5 is a flowchart of a method for synthesizing a unique nontoxic aqueous Cu—Zn electroplating (chemical) solution, in accordance with the present invention.

FIG. 5 flowcharts, by example only, a method M1 for synthesizing a liter of a unique nontoxic aqueous Cu—Zn electroplating (chemical) solution, in accordance with the present invention:

(1) cleaning a mixing vessel (e.g. a beaker) with dilute nitric acid ($HNO_3$) for approximately 5 minutes, as indicated by block 1001;

(2) rinsing the mixing vessel in deionized (DI) water for approximately 5 minutes to approximately 10 minutes and subsequently dying the mixing vessel for instance, under a gaseous nitrogen ($GN_2$) flow, as indicated by block 1002;

(3) adding an initial volume of DI water (e.g., approximately 400 ml) to the mixing vessel, as indicated by block 1003;

(4) adding at least one Cu ion source for providing a plurality of Cu ions and stirring the at least one Cu ion source into the DI water for a duration in a range of approximately 5 minutes to approximately 10 minutes or until complete dissolution of the at least one Cu ion source in the DI water is achieved, as indicated by block 1004;

(5) adding at least one complexing agent for complexing the plurality of Cu ions and stirring the at least one complexing agent until complete dissolution of the at least one complexing agent in the DI water is achieved, as indicated by block 1005;

(6) adding at least one pH adjuster and stirring the at least one pH adjuster into the DI water for a duration in a range of approximately 5 minutes to approximately 10 minutes or until a clean and transparent solution is achieved, as indicated by block 1006;

(7) measuring the pH of the solution, and, if the pH is within the desired range, proceeding to step (8), otherwise titrating the solution with a small volume of the at least one pH adjuster until the pH falls within the desired range, in essence, returning to step (6), as indicated by block 1007;

(8) adding at least one Zn ion source for providing a plurality of Zn ions and stirring the at least one Zn ion source into the DI water for a duration in a range of approximately 5 minutes to approximately 10 minutes or until complete dissolution of the at least one Zn ion source in the DI water is achieved, as indicated by block 1008;

(9) adding a final volume of DI water (e.g., effecting approximately 1 L in total solution volume) to the mixing vessel, as indicated by block 1009;

(10) optionally adding at least one complexing agent for complexing the plurality of Zn ions and stirring the at least one complexing agent until complete dissolution of the at least one complexing agent in the DI water is achieved, as indicated by block 1010; and (11) measuring the pH of the solution, and, if the pH is within the desired range, terminating the synthesis, otherwise further titrating the solution with a small volume of the at least one pH adjuster until the pH falls within the desired range, in essence, returning to step (10), as indicated by block 1011.

In addition, the present invention chemical solution may be formulated as follows: wherein the at least one zinc (Zn) ion source comprises at least one zinc salt selected from a group consisting essentially of zinc acetate (($CH_3CO_2)_2Zn$), zinc bromide ($ZnBr_2$), zinc carbonate hydroxide ($ZnCO_3·2Zn(OH)_2$), zinc dichloride ($ZnCl_2$), zinc citrate (($O_2CCH_2C(OH)CO_2)CH_2CO_2)_2Zn_3$), zinc iodide ($ZnI_2$), zinc L-lactate (($CH_3CH(OH)CO_2)_2Zn$), zinc nitrate ($Zn(NO_3)_2$), zinc stearate (($CH_3(CH_2)_{16}CO_2)_2Zn$), zinc sulfate ($ZnSO_4$), zinc sulfide ($ZnS$), zinc sulfite ($ZnSO_3$), and their hydrates (preferably zinc chloride or zinc dichloride and zinc citrate), wherein the optional at least one complexing agent for complexing the plurality of Zn ions comprises tartric acid ($HO_2CCH(OH)CH(OH)CO_2H$), wherein the tartaric acid prevents precipitation of the plurality of Zn ions from the chemical solution, wherein the at least one copper (Cu) ion source comprises at least one copper salt selected from a group consisting essentially of copper(I) acetate ($CH_3CO_2Cu$), copper(II) acetate ($CH_3CO_2Cu$), copper(I) bromide ($CUBr$), copper(II) bromide ($CuBr_2$), copper (II) hydroxide ($CU(OH)_2$), copper(II) hydroxide phosphate ($Cu_2(OH)PO_4$), copper(I) iodide ($CuI$), copper(II) nitrate hydrate (($CuNO_3)_2$), copper(II) sulfate ($CuSO_4$), copper(I) sulfide ($Cu_2S$), copper(II) sulfide ($CuS$), copper(II) tartrate (($CH(OH)CO_2)_2Cu$), and their hydrates (preferably copper sulfate), wherein the at least one complexing agent for the plurality of Cu ions comprises at least one species selected from a group consisting essentially of ethylene diamine "EDA" ($H_2NCH_2CH_2NH_2$) and ethylenediaminetetraacetic acid "EDTA" (($HO_2CCH_2)_2NCH_2CH_2N(CH_2CO_2H)_2$), wherein the EDTA prevents precipitation of the plurality of Cu ions from the chemical solution, wherein the at least one pH adjuster comprises at least one pH-adjusting compound selected from a group consisting essentially of ammonium hydroxide ($NH_4OH$) and tetranethylammonium hydroxide "TMAH" (($CH_3)_4NOH$), wherein the at least one wetting agent comprises a surfactant, and wherein the surfactant comprises at least one surfactant selected from a group consisting essentially of RE-610™ and polyethylene glycol (PEG).

In the preferred embodiment of the chemical solution, the composition of the method M1 is formulated with component concentration ranges as follows: wherein the at least one zinc (Zn) ion source is provided in a concentration range of approximately 5 g/L to approximately 10 g/L (preferably approximately 10 g/L), wherein the at least one complexing agent for complexing the plurality of Zn ions is provided in a concentration range of approximately 10 g/L to approximately 30 g/L (preferably approximately 20 g/L), wherein the at least one copper (Cu) ion source is provided in a concentration range of approximately 5 g/L to approximately 20 g/L (preferably approximately 10 g/L), wherein the at least one complexing agent for complexing the plurality of Cu ions is provided in a concentration range of approximately 40 g/L to approximately 100 g/L (preferably approximately 80 g/L), wherein the at least one pH adjuster is provided in a concentration range of approximately 10 g/L to approximately 20 g/L (preferably approximately 15 g/L), wherein the at least one wetting agent is provided in a concentration range of approximately 0.01 g/L to approximately 0.1 g/L (preferably approximately 0.02 g/L), wherein the volume of water is provided in a volume range of up to and including approximately 1 L, wherein the solution flow rate is in a range of approximately less than 3 L/min, wherein the solution stir rate is in a range of approximately less than 700 rpm, and wherein the wafer rotation rate is in a range of approximately less than or equal to 700 rpm.

Also, the preferred embodiment involves the following process parameters ranges: wherein the at least one pH adjuster adjusts the chemical solution to a pH range of approximately 7 to approximately 14 (preferably in a pH range of approximately 10 to approximately 12), wherein the chemical solution may be maintained in a temperature range of approximately 16° C. to approximately 35° C. (preferably at a temperature of approximately 24° C.), wherein the Cu surface 20 is electroplated for a duration in a range of approximately 30 seconds to approximately 120 seconds (preferably for a duration of approximately 60 sec), wherein the Cu—Zn alloy fill 30 is formed having a thickness in a range of approximately 10 mn (100 Å) to approximately 200 nm (2000 Å) (preferably having a thickness of approximately 30 nm), and wherein the formed Cu-rich Cu—Zn alloy fill 30 has a low Zn content of approximately 10 at.% and a high Cu content of approximately 90 at.% (preferably approximately 0.2 at.% to approximately 2.0 at.% Zn and preferably approximately 98 at% to approximately 99.8 at.% Cu).

Figure 6:
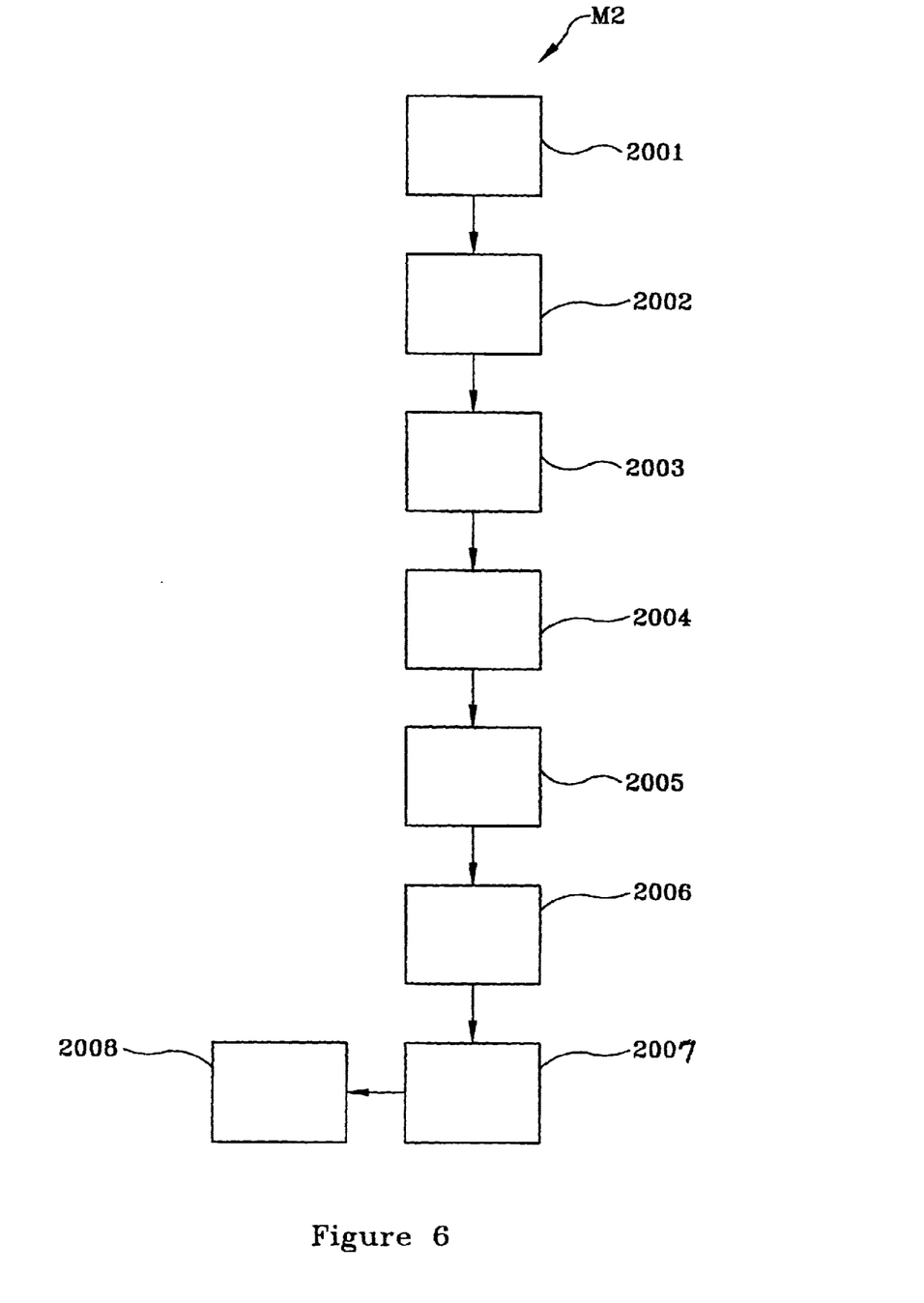
FIG. 6 is a flowchart of a method for forming a Cu—Zn alloy fill on a Cu surface, in accordance with the present invention.

FIG. 6 flowcharts, by example only, a method M2 of fabricating a semiconductor device, having a reduced-oxygen copper-zinc (Cu—Zn) alloy fill 30 formed on a copper (Cu) surface 20, the Cu surface 20 having been formed by CVD, PVD, PECVD, electroless plating, or electroplating, the alloy fill 30 formed by electroplating the Cu surface 20 in a chemical solution, initially comprising the steps of: providing a semiconductor substrate 4 having a Cu surface 20, an optional barrier layer 10, and an optional underlayer 19 formed in a via 6, as indicated by block 2001; providing a chemical solution, the chemical solution comprising: at least one zinc (Zn) ion source for providing a plurality of Zn ions; at least one copper (Cu) ion source for providing a plurality of Cu ions; at least one complexing agent for complexing the plurality of Cu ions; at least one pH adjuster, at least one wetting agent for stabilizing the chemical solution, all being dissolved in a volume of deionized (DI) water, as shown by block 2002; electroplating the Cu surface 20 in the chemical solution, thereby forming a Cu—Zn alloy fill 30 in the via 6 and on the Cu surface 20, as indicated by block 2003; rinsing the Cu—Zn alloy fill 30 in a solvent, as indicated by block 2004; drying the Cu—Zn alloy fill 30 under a gaseous flow, for instance, under a gaseous nitrogen flow (GN$_2$), as indicated by block 2005; annealing the Cu—Zn alloy fill 30 formed in the via 6 and on the Cu surface 20 in a temperature range such as 150° C. to 450° C. (preferably in a temperature of approximately 150° C. to approximately 350° C.), wherein the annealing step is performed for a duration range of approximately 0.5 minutes to approximately 60 minutes, thereby reducing the oxygen impurity concentration to a level less than that which is detectable (i.e.,~0.1 at.%) in the alloy thin film 30, thereby modifying the grain structure by increasing the grain size of both the alloy fill layer 30 as well as the Cu surface 20, and thereby forming a mixed interface comprising the Cu—Zn—Sn—Pd alloy layer 29, thereby forming a reduced-oxygen Cu—Zn alloy having a uniform zinc distribution, as indicated by block 2006; planarizing, by a technique such as chemical mechanical polishing (CMP), the reduced-oxygen Cu—Zn alloy fill 30, the Cu surface 20, the optional barrier layer 10, and the optional underlayer 19, thereby completing formation of a Cu—Zn filled dual-inlaid interconnect structure 35, as indicated by block 2007; and completing formation of the semiconductor device, as indicated by block 2008. The annealing step also facilitates doping of the interfaces of the Cu—Zn alloy fill 30 with desirable Sn and Pd impurities from the optional underlayer 19 which structurally stabilizes the film layers 29, 30 by internally increasing its bond strengths. The chemical solution may further comprise at least one complexing agent for complexing the plurality of Zn ions also being dissolved in the volume of DI water.

Figure 7:
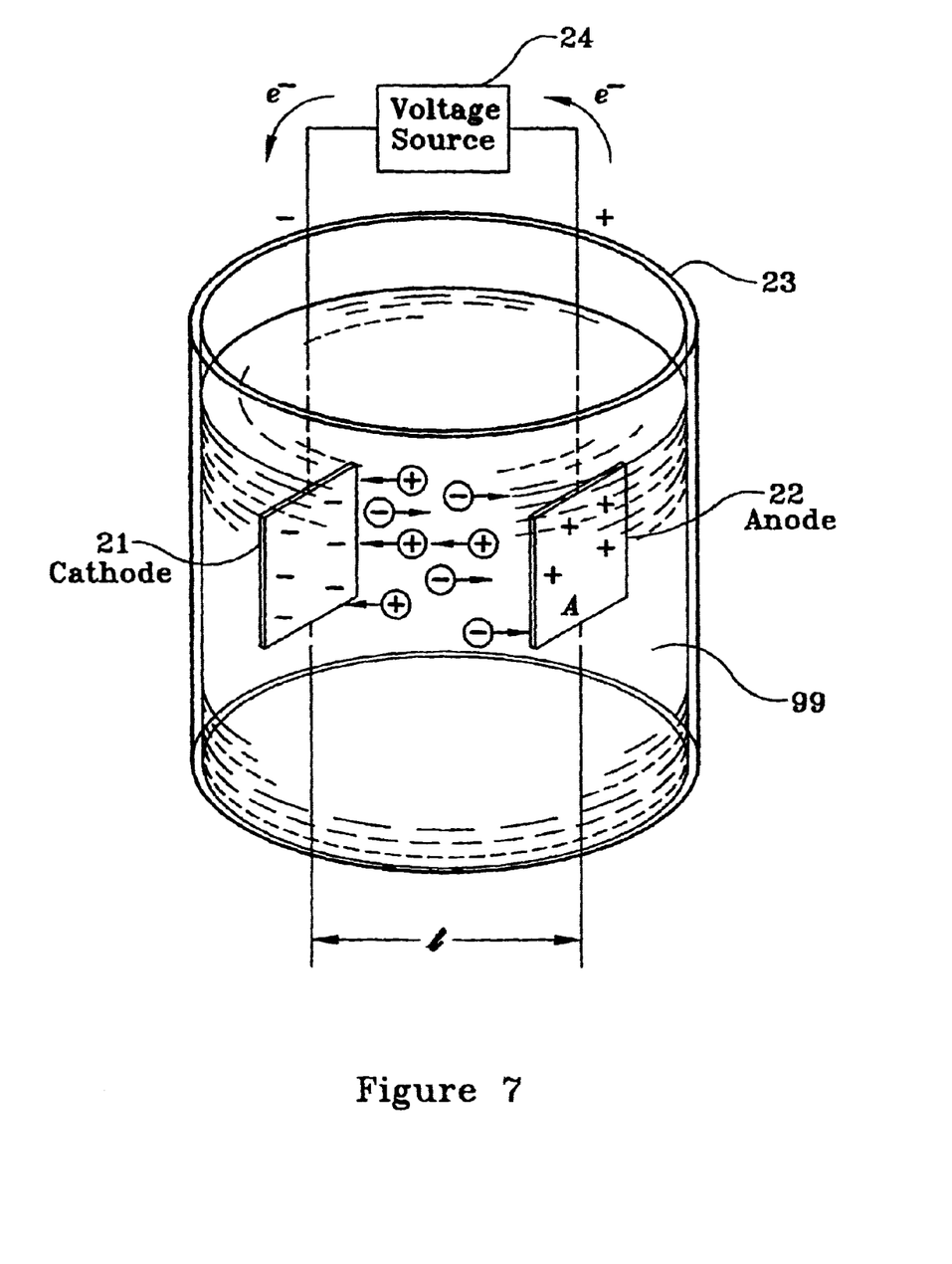
FIG. 7 is a perspective view of an electroplating apparatus using the unique nontoxic aqueous Cu—Zn chemical solution, in accordance with the present invention.

FIG. 7 illustrates, in perspective view, an electroplating apparatus using the unique nontoxic aqueous Cu—Zn chemical solution, in accordance with the present invention. In particular, the electroplating step (3) of FIG. 3 may be performed in this electroplating apparatus comprising: (a) a cathode-wafer 21; (b) an anode 22; (c) an electroplating vessel 23 such as a beaker, and (d) a voltage source 24. The cathode-wafer 21 may comprise a Cu surface 20. The anode 22 may comprise at least one material selected from a group consisting essentially of copper (Cu), a copper-platinum alloy (Cu—Pt), titanium (Ti), platinum (Pt), a titanium-platinum alloy (Ti—Pt), anodized copper-zinc alloy (Cu—Zn, i.e., brass), and platinized titanium (Pt/Ti), and platinized copper-zinc (Pt/Cu—Zn, i.e., platinized brass). The brass alloy may be anodized to form a thin oxide film in situ using the chemical solution 99 prior to electroplating the cathode-wafer 21. The anodized brass anode also provides the following benefits: (1) a uniform current density distribution on the cathode-wafer; (2) a uniform Cu—Zn alloy fill formation, (3) a uniform Zn distribution across the Cu—Zn alloy fill surface, and (4) a uniform Zn distribution across the Cu—Zn alloy fill thickness. The present invention electroplating method also comprises direct voltage in the range of approximately 1 V to approximately 4 V (preferably in a voltage range of approximately 1 V to approximately 2 V); and a direct current in the range of approximately 0.01 A to approximately 0.2 A (preferably in a current range of approximately 0.1 A to approximately 0.15 A). Differential pulse conditions selected from a group consisting essentially of forward pulses, reverse pulses, combinations of forward and reverse pulses, combinations of direct current, and combinations of direct voltage may also be applied.

Further, the Zn-doping in the resultant Cu—Zn alloy fill 30 may be controlled in the present invention by varying electroplating conditions. For example, increasing the at least one zinc (Zn) ion source concentration slowly increases Zn-doping, increasing the at least one copper (Cu) ion source concentration slowly decreases Zn-doping, increasing the solution flow rate increases Zn-doping, increasing the pH decreases cathodic efficiency with respect to Zn and thereby decreases Zn-doping, increasing the electroplating duration slowly decreases Zn-doping, using a Cu anode decreases Zn-doping, using a brass anode increases Zn-doping, increasing the voltage increases the Zn-doping, and increasing the current increases the Zn-doping.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

INDUSTRIAL APPLICABILITY

The present invention relates to the semiconductor device fabrication industry. More particularly, the present invention relates to reducing electromigration in copper interconnect lines by doping their surfaces with a barrier material using wet chemical methods. Specifically, the present invention provides a method of fabricating a semiconductor device, having a reduced-oxygen copper-zinc (Cu—Zn) alloy fill formed on a copper (Cu) surface by electroplating the Cu surface in a chemical solution, generally comprising the steps of providing a semiconductor substrate having a Cu surface (e.g., seed layer), the Cu surface having been formed by CVD, PVD, PECVD, ALD, or electroplating, an optional barrier layer, and an optional underlayer formed in a via; providing a chemical solution; inmmersing the Cu surface in the chemical solution, thereby forming a Cu—Zn alloy fill on the Cu surface in the via; rinsing the Cu—Zn alloy fill in a solvent; drying the Cu—Zn alloy fill under a gaseous flow; annealing the Cu—Zn alloy fill formed on the Cu surface, thereby forming a reduced-oxygen Cu—Zn alloy fill; planarizing the reduced-oxygen Cu—Zn alloy fill, the Cu surface, the optional barrier layer, and the optional underlayer, thereby forming a Cu—Zn alloy dual-inlaid interconnect structure; and completing formation of the semiconductor device.

What is claimed:

1. A method of fabricating a semiconductor device, having a reduced-oxygen copper-zinc (Cu—Zn) alloy filled dual-inlaid interconnect structure formed on a copper (Cu) surface formed by electroplating the Cu surface in a chemical solution, comprising the steps of:

providing a semiconductor substrate having a Cu surface formed in a via;

providing a chemical solution;

electroplating the Cu surface in the chemical solution thereby forming said a Cu—Zn alloy fill in the via and on the Cu surface,
   wherein said electroplating comprises using an electroplating apparatus,
   wherein said electroplating apparatus comprises:
      (a) a cathode-wafer,
      (b) an anode,
      (c) electroplating vessel; and
      (d) a voltage source, and
   wherein the cathode-wafer comprises the Cu surface,
   rinsing the Cu—Zn alloy fill in a solvent;

drying the Cu—Zn alloy fill under a gaseous flow;

annoling the Cu—Zn alloy fill formed in the via and directly deposited on the Cu surface, thereby forming a reduced-oxygen Cu—Zn alloy fill having an alloy surface and an alloy thickness and having a uniform zinc distribution across said alloy surface and said alloy thickness;

planarizing the reduced-oxygen Cu—Zn alloy fill and the Cu surface, thereby completing formation of a reduced-oxygen Cu—Zn alloy filled dual-inlaid interconnect structure; and completing formation of the semiconductor device.

2. A method, as recited in claim 1, wherein the chemical solution is nontoxic and aqueous, and wherein the chemical solution comprises:
   at least one zinc (Zn) ion source for providing a plurality of Zn ions;
   at least one copper (Cu) ion source for providing a plurality of Cu ions;
   at least one complexing agent for complexing the plurality of Cu ions;
   at least one pH adjuster,
   at least out wetting agent for stabilizing the chemical solution, all being dissolved in a volume of deoinized (DI) water.

3. A method, as recited in claim 2, wherein the at least one zinc (Zn) ion source comprises at least one zinc salt selected from a group consisting essentially of zinc acetate $((CH_3CO_2)_2Zn)$, zinc bromide $(ZnBr_2)$, zinc carbonate hydroxide $(ZnCO_3.2Zn(OH)_2)$, zinc dichloride $(ZnCl_2)$, zinc citrate $((O_2CCH_2C(OH)(CO_2)CH_2CO_2)_2Zn_3$ zinc iodide $(ZnI_2)$, zinc L-lactate $((CH_3CH(OH)CO_2)_2Zn)$, zinc nitrate $(Zn(NO_3)_2)$, zinc stearate $((CH_3(CH_2)_{16}CO_2)_2Zn)$, zinc sulfate $(ZnSO_4)$, zinc sulfide $(ZnS)$, zinc sulfite $(ZnSO_3)$, and their hydrates.

4. A method, as recited in claim 2, wherein the at least one copper (Cu) ion source comprises at least one copper salt selected from a group consisting essentially of copper(I) acetate $(CH_3CO_2Cu)$, copper (II) acetate $((CH_3CO_2)_2Cu)$, copper(I) bromide (CuBr), copper(II) bromide $(CuBr_2)$, copper(II) hydroxide $(Cu(OH)_2)$ copper(II) hydroxide phosphate $(Cu_2(OH)PO_4)$, copper(I) iodide (CuI), copper(II) nitrate $((CuNO_3)_2)$, copper(II) sulfate $(CuSO_4)$, copper(I) sulfide $(Cu_2S)$, copper(II) sulfide (CuS), copper(II) tartrate $((CH(OH)CO_2)_2Cu)$, and their hydrates.

5. A method, as recited in claim 1, wherein the anode comprises at least one marterial selected from a group consisting essentially of copper (Cu), a copper-platinum alloy (Cu—Pt), titanium (Ti), platinum (Pt), a titanium-platinum alloy (Ti—Pt), an anodized copper-zinc alloy (Cu—Zn, i.e., brass), a platinized titanium (Pt/Ti), and a platinized copper-zinc (Pt/Cu—Zn, i.e., platinized brass).

6. A method, as recited in claim 1,
wherein said semiconductor substrate further comprises a barrier layer formed in the via under said Cu surface, and
wherein the barrier layer comprises at least one material selected from a group consisting essentially of titanium silicon nitride $Ti_xSi_yN_z$), tantalum nitride (TaN), and tungsten nitride ($W_xN_y$).

7. A method, as recited in claim 6,
wherein said semiconductor substrate further comprises an underlayer formed on the barrier layer,
wherein said underlayer comprises at least one material selected from a group consisting essentially of tin (Sn) and pallatium (Pd), end
wherein said Cu surface is formed over said barrier layer and on said underlayer.

8. A method, as recited in claim 7,
wherein said underlayer comprises a thickness range of approximately 15 Å to approximately 50 Å,
wherein said barrier layer comprises a thickness range of approximately 30 Å to approximately 50 Å,
wherein said Cu surface comprises a thickness range of approximately 50 Å to approximately 70 Å, and
wherein said Cu—Zn alloy fill comprises a thickness range of approximately 300 Å to approximately 700 Å.

9. A method, as recited in claim 1,
wherein the annealing steps are performed in a temperature range of approximately 150° C. to approximately 450° C., and
wherein the annealing steps are performed for a duration range of approximately 0.5 minutes to approximately 60 minutes.

10. A semiconductor device, having a reduced-oxygen copper-zinc (Cu—Zn) alloy filled dual-inlaid interconnect structure formed on a copper(Cu) surface formed by electroplating the Cu surface in a chemical solution, fabricated by a method comprising the steps of:
providing a semiconductor substrate having a Cu surface formed in a via;
providing a chemical solution;
electroplating the Cu surface in the chemical solution, thereby forming a Cu—Zn alloy fill in the via and on the Cu surface;
wherein said electroplating comprises using an electroplating apparatus, wherein said electroplating apparatus comprises:
(a) a cathode-wafer,
(b) an anode;
(c) electroplating vessel; and
(d) a voltage source, and
wherein said cathode-wafer comprises the Cu surface, rinsing the Cu—ZN alloy fill in a solvent; drying the Cu—Zn alloy fill under a gaseous flow; annealing the Cu—Zn alloy fill formed in the via and directly deposited on the Cu surface,
thereby forming a reduced-oxygen Cu—Zn alloy fill having an alloy surface and an alloy thickness and having a uniform zinc distribution across said alloy surface and said alloy thickness;
planarizing the reduced-oxygen Cu—Zn alloy fill and the Cu surface, thereby completing formation of a reduced-oxygen Cu—Zn alloy filled dual-inlaid interconnect structure; and
completing formation of the semiconductor device.

11. A device, as recited in claim 10,
wherein the chemical solution is nontoxic and aqueous, and
wherein the chemical solution comprises:
at least one zinc (Zn) ion source for providing a plurality of Zn ions;
at least one copper (Cu) ion source for providing a plurality of Cu ions;
at least one complexing agent for complexing the plurality of Cu ions;
at least one pH adjuster;
at least one wetting agent for stabilizing the chemical solution, all being dissolved in a volume of deionized (DI) water.

12. A device, as recited in claim 11,
wherein the at least one zinc (Zn) ion source comprises at least on zinc salt selected from a group consisting essentially of zinc acetate (($CH_3CO_2$)Zn), zinc bromide ($ZnBr_2$), zinc carbonate hydroxide ($ZnCO_3.2Zn(OH)_2$), zinc dichloride ($ZnCl_2$) zinc citrate ($O_2CCH_2C(OH)(CO_2)CH_2CO_2)_2Zn_3$), zinc iodide ($ZnI_2$), zinc L-lactate (($CH_3CH(OH)CO_2)_2Zn$), zinc nitrate ($Zn(NO_3)_2$), zinc stearate (($CH_3(CH_2)_{16}CO_2)_2Zn$), zinc sulfate ($ZnSO_4$), zinc sulfide (ZnS), zinc sulfite ($ZnSO_3$) and their hydrates.

13. A device, as recited in claim 11,
wherein the at least one copper (Cu) ion source comprises at least one copper salt selected from a group consisting essentially of copper(I) acetate ($CH_3CO_2Cu$), copper (II) acetate (($CH_3CO_2Cu$), copper(I) bromide (CuBr), copper(II) bromide ($CuBr_2$), copper(II) hydroxide (Cu $(OH)_2$), copper(II) hydride phosphate ($Cu_2(OH)PO_4$), copper(I) iodide (CuI), copper(II) nitrate hydrate (($CuNO_3)_2$), copper(II) sulfate ($CuSO_4$), copper(I) sulfide ($Cu_2S$), copper(II) sulfide (CuS), copper(II) tartrate (($CH(OH)CO_2)_2Cu$), and their hydrates.

14. A device, as recited in claim 10,
wherein the anode comprise at least one material selected from a group consisting essentially of copper (Cu), a copper-platinum alloy (Cu—Pt), titanium (Ti), platinum (Pt), a titanium-platinum alloy (Ti—Pt), and anodized copper-zinc alloy (Cu—Zn, i.e., brass), a platinized titanium (Pt/Ti), and a platinized copper-zinc (Pt/Cu—Zn, i.e., brass).

15. A device, as recited in claim 10,
wherein said semiconductor substrate further comprises a barrier layer formed in the via under said Cu surface, and
wherein the barrier layer comprises at least one material selected from a group consisting essentially of titanium silicon nitride ($Ti_xSi_yN_2$), tantalum nitride (TaN), and tungsten nitride ($W_xN_y$).

16. A device, as recited in claim 15,
wherein said semiconductor substrate further comprises an underlayer formed on the barrier layer,
wherein said underlayer comprises at least one material selected from a group consisting essentially of tin (Sn) and palladium (Pd), and
wherein said Cu surface is formed over said barrier layer and on said underlayer.

17. A device, as recited in claim 16;
wherein said underlayer comprises a thickness range of approximately 15 Å to approximately 50 Å, wherein said barrier layer comprises a thickness range of approximately 30 Å to approximately 50 Å, wherein said Cu surface comprises a thickness range of approximately 50 Å to approximately 70 Å, and wherein said Cu—Zn alloy fill comprises a thickness range of approximately 300 Å to approximately 700 Å.

18. A semiconductor device, having a first interim reduced-oxygen copper-zinc (Cu—Zn) alloy fill formed on a copper (Cu) surface and a second interim reduced-oxygen Cu—Zn alloy fill formed on a Cu-fill, both films being formed by electroplating the Cu surface and the Cu-fill, respectively, in a chemical solution, comprising:

a semiconductor substrate having a via; and an encapsulated dual-inlaid interconnect formed and disposed in said via, said interconnect structure comprising:

at least one Cu surface formed in said via;

a first interim reduced-oxygen Cu—Zn alloy fill formed and disposed on the at least one Cu surface;

a Cu-fill formed and disposed on said interim reduced-oxygen Cu—Zn alloy fill; and a second interim reduced-oxygen Cu—Zn alloy fill formed and disposed on the Cu-fill.

* * * * *